(12) United States Patent
Boys et al.

(10) Patent No.: US 8,183,938 B2
(45) Date of Patent: May 22, 2012

(54) TUNING METHODS AND APPARATUS FOR INDUCTIVELY COUPLED POWER TRANSFER (ICPT) SYSTEMS

(75) Inventors: John Talbot Boys, Auckland (NZ); Grant Anthony Covic, Auckland (NZ)

(73) Assignee: Auckland Uniservices Limited, Auckland (NZ)

( * ) Notice: Subject to any disclaimer, the term of this patent is extended or adjusted under 35 U.S.C. 154(b) by 549 days.

(21) Appl. No.: 11/912,920

(22) PCT Filed: Apr. 28, 2006

(86) PCT No.: PCT/NZ2006/000091
§ 371 (c)(1),
(2), (4) Date: May 30, 2008

(87) PCT Pub. No.: WO2006/118475
PCT Pub. Date: Nov. 9, 2006

(65) Prior Publication Data
US 2009/0302933 A1    Dec. 10, 2009

(30) Foreign Application Priority Data

Apr. 29, 2005 (NZ) ........................... 539771

(51) Int. Cl.
*H03J 7/14*     (2006.01)
*H01F 27/24*    (2006.01)

(52) U.S. Cl. .......... 331/36 L; 331/25; 323/356; 323/362
(58) Field of Classification Search .................. 331/25, 331/36 C, 36 L; 323/356, 362
See application file for complete search history.

(56) References Cited

U.S. PATENT DOCUMENTS

| 5,293,308 A | 3/1994 | Boys et al. |
| 2003/0210106 A1 | 11/2003 | Cheng et al. |
| 2007/0109708 A1* | 5/2007 | Hussman et al. ............. 361/113 |

FOREIGN PATENT DOCUMENTS

| GB | 2156174 | 10/1985 |
| WO | 99/26329 | 5/1999 |
| WO | 2004/105208 | 12/2004 |
| WO | 2004/105226 | 12/2004 |
| WO | 2005/031944 | 4/2005 |

* cited by examiner

*Primary Examiner* — James E Goodley
(74) *Attorney, Agent, or Firm* — Law Office of Richard F. Jaworski P.C.

(57) ABSTRACT

A method is provided for controlling a resonant circuit (1) of an ICPT system. The resonant circuit has a controlled variable reactance (2), and a predetermined perturbation is introduced in the magnitude of variable reactance. The change in a property of the resonant circuit in response to the perturbation is sensed, and the variable reactance is varied to alter the resonant frequency of the circuit in response to the sensed change.

17 Claims, 3 Drawing Sheets

TUNING METHODS AND APPARATUS FOR INDUCTIVELY COUPLED POWER TRANSFER (ICPT) SYSTEMS

CROSS REFERENCE TO PRIOR APPLICATIONS

This application is the U.S. national phase of International Application No. PCT/NZ2006/000091 filed Apr. 28, 2006, which claims priority from New Zealand Patent Application No. 539771 filed Apr. 29, 2005. The international application published in English on Nov. 9, 2006 as WO 2006/118475 A1.

FIELD OF THE INVENTION

This invention relates to inductively coupled power transfer (ICPT) systems, and in particular to tuning or de-tuning resonance circuits relating to the systems.

BACKGROUND OF THE INVENTION

ICPT systems are well known for a number of industrial applications where traditional methods are unable to perform in certain applications such as clean rooms, people moving, materials handling, and battery charging.

A basic ICPT system consists of three main components, being a power supply, a primary track or coil usually consisting of an elongate conductive path, and one or more pick-ups to which energy from the primary conductive path is transferred in a contactless manner. The operation of an ICPT system is described in the U.S. Pat. No. 5,293,308 (Boys et al) the contents of which are incorporated herein by reference.

The operating frequency of an ICPT system is affected by the type of application and the power switches that are currently available. The mutual inductance between the pick-up and the primary conductive path is directly influenced by the proximity of the pick-up to the primary path (or track as it is commonly known) and the magnetic material coupling the two.

The observed quality factor (Q) is a direct function of the controlled load. Staying at the resonant frequency irrespective of Q is difficult due to a component variations resulting from time and temperature degradation and proximity to undesirable magnetic material. Additionally, having to match components in a statically tuned system adds costs and complexity to the manufacturing process.

Therefore, overcoming problems associated with component variations which make it difficult to maintain resonance with high Q's is a significant issue in ICPT systems.

SUMMARY OF THE INVENTION

It is an object of the present invention to provide a method or apparatus for controlling a resonant circuit of an ICPT system which will at least go some way toward overcoming disadvantages associated with known systems or methods, or which will at least provide the public with a useful choice.

Further objects of the invention will become apparent from the following description.

Accordingly in one aspect the invention consists in a method for controlling a resonant circuit of an ICPT system, the method including the steps of:
introducing a predetermined perturbation in a magnitude of a variable reactance in the resonant circuit;
sensing a change in a property of the resonant circuit in response to the perturbation, and;
varying the variable reactance to alter the resonant frequency of the circuit in response to the sensed change.

Preferably the sensed change is used to determine whether the frequency of operation of the circuit is above or below the resonant frequency of the circuit.

Preferably the step of varying the variable reactance comprises varying the reactance to bring the resonant frequency of the circuit toward the frequency of operation.

Alternatively the step of varying the variable reactance comprises providing a desired output of the circuit and varying the reactance to change the resonant frequency of the circuit to bring an output of the resonant circuit toward a desired output.

Preferably the perturbation is cyclical.

Preferably, the method includes a step of using an integral controller to integrate the sensed change to provide a control signal for varying the variable reactance.

Preferably the step of introducing a predetermined perturbation includes applying an alternating signal of predetermined magnitude to the variable reactance.

Preferably the perturbation varies the variable reactance in such a way as to alter the frequency of the resonant circuit over a range of approximately 1%.

Preferably the perturbation results in the frequency of the resonant circuit being changed in a cyclical fashion at a rate of approximately 20 Hz.

Preferably the sensed change in a property of the resonance circuit is the current which is either increased or decreased in response to the perturbation, to provide an indication as to whether the frequency of the resonance circuit is less than or greater than a natural frequency of the circuit.

In a further aspect the invention consists in an ICPT system including a resonant circuit having a variable reactance, and control means adapted to:
controllably vary a variable reactance in the resonant circuit;
introduce a predetermined perturbation in a magnitude of the variable reactance;
sense a change in a property of the resonant circuit in response to the perturbation, and;
vary the variable reactance to alter the resonant frequency of the circuit in response to the sensed change.

In a further aspect the invention consists in an ICPT system pick-up including a resonant circuit having a variable reactance, and control means adapted to:
controllably vary a variable reactance in the resonant circuit;
introduce a predetermined perturbation in a magnitude of the variable reactance;
sense a change in a property of the resonant circuit in response to the perturbation, and;
vary the variable reactance to alter the resonant frequency of the circuit in response to the sensed change.

In a further aspect the invention consists in an ICPT system power supply including a resonant circuit having a variable reactance, and control means adapted to:
controllably vary a variable reactance in the resonant circuit;
introduce a predetermined perturbation in a magnitude of the variable reactance;
sense a change in a property of the resonant circuit in response to the perturbation, and;
vary the variable reactance to alter the resonant frequency of the circuit in response to the sensed change.

Unless the context clearly requires otherwise, throughout the description, the words "comprise", "comprising", and the like, are to be construed in an inclusive sense as opposed to an exclusive or exhaustive sense, that is to say, in the sense of "including, but not limited to".

DRAWING DESCRIPTION

One or more embodiments of the invention will now be described with reference to the accompanying drawings in which:

FIG. 1 is a circuit schematic of an ICPT pick-up including a tuning circuit according to one embodiment of the invention.

FIGS. 2(a)-2(d) show gating signals for switches related to the circuit of FIG. 1 together with voltage and current waveforms.

FIGS. 3(a)-3(c) show three different graphs of voltage or current for the circuit of FIG. 1 shown against frequency.

DESCRIPTION OF ONE OR MORE PREFERRED EMBODIMENTS

Figure 1:
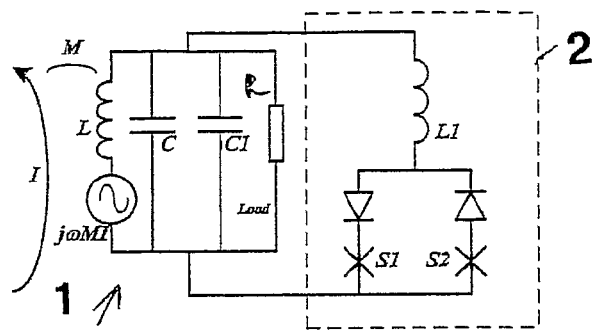

Referring to FIG. 1, a pick-up for an ICPT system is shown generally referenced 1. The pick-up includes a pick-up coil L and a tuning capacitor C across which a load R is in practice connected. The circuit includes a tuning circuit 2 which includes an inductance L1 that can be selectively switched across the pick-up coil and tuning capacitor using switches S1 and S2. A further capacitor, being a compensating capacitor, C1 is also provided. Under normal operating conditions the current through L1 is balanced by the current through C1, and the circuit has no effect on the pick-up tuning. However, if the current through L1 is increased, then the pick-up tunes to a higher frequency. If the current through L1 is reduced, then the pick-up tunes to a lower frequency. Therefore, in operation the resonance in the pick-up is maintained by varying the current in the tuning inductance L1. Those skilled in the art to which the invention relates will appreciate that a variable tuning capacitance may also or alternatively be used.

Figure 2:
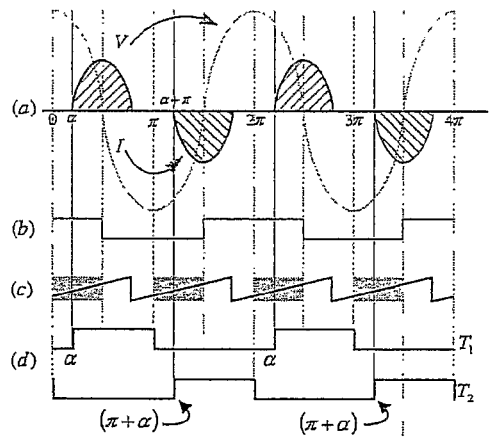

The switching devices S1 and S2 shown in FIG. 1 are operated with a turn on delay angle $\alpha$ in their respective half cycles. Turning to FIG. 2 the delay can be seen in FIG. 2a measured with respect to voltage across the resonant circuit. A series of diodes block the current flow through L1 after the current zero crossing, preventing a reverse current flow through the switches. Switch S1 controls the first current pulse for $\alpha$ in the range from 0 to $\pi/2$ and switch S2 is for a negative pulse for $\alpha$ from $\pi$ to $3\pi/2$. To produce $\alpha$, a square wave as shown in FIG. 2b is used as input to a phase locked loop and an output delayed at 45° from transitions in FIG. 2b is used to produce a saw tooth wave form shown in FIG. 2c at twice the frequency. The required range for $\alpha$ corresponds to the shaded blocks as shown in FIG. 2c, so that a simple comparator operating with a variable DC level and waveform (as shown by shaded areas in FIG. 2c) can be used to produce the correct firing instance for the switches as shown by wave forms T1 and T2 in FIG. 2d. Each waveform starts at a variable $\alpha$ controllable over a full range of $\alpha$ and ends at $\pi$ for T1 or $2\pi$ for T2. If T1 and T2 are operated with minimum $\alpha$ continuous conduction is achieved. Further description of implementation of this is provided below.

Figure 3:
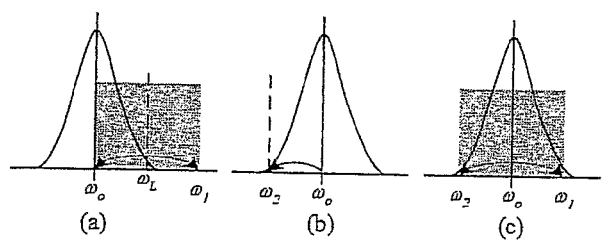

Turning now to FIGS. 3a-c, a range of tuning for inductor L1 is shown. In FIG. 3a the tuning range of the inductor is shown in shading when tuning capacitor C1 is not present. In FIG. 3b, the frequency shift which is introduced by C1 when L1 is not present as shown. In FIG. 3c, the possible tuning range that exists when both L1 and C1 are combined in the circuit is shown. Therefore, the addition of C1 allows bi-directional control from the centre of the variable tuning range. The excess reactance is then tuned out by controlling the variable inductor.

Figure 4:
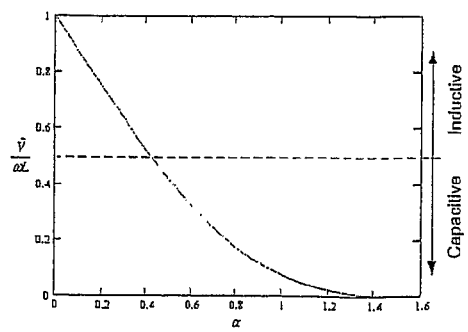
FIG. 4 is a graph of calculated per unit current in variable inductor of FIG. 1 shown against the delay angle.

FIG. 4 shows the calculated currents through L1 with varying $\alpha$. It can be said that varying $\alpha$ from zero to $\pi/4$ makes a variable inductance vary from L1 to infinity, allowing the resonant frequency of the pick-up to be controlled.

Figure 10:
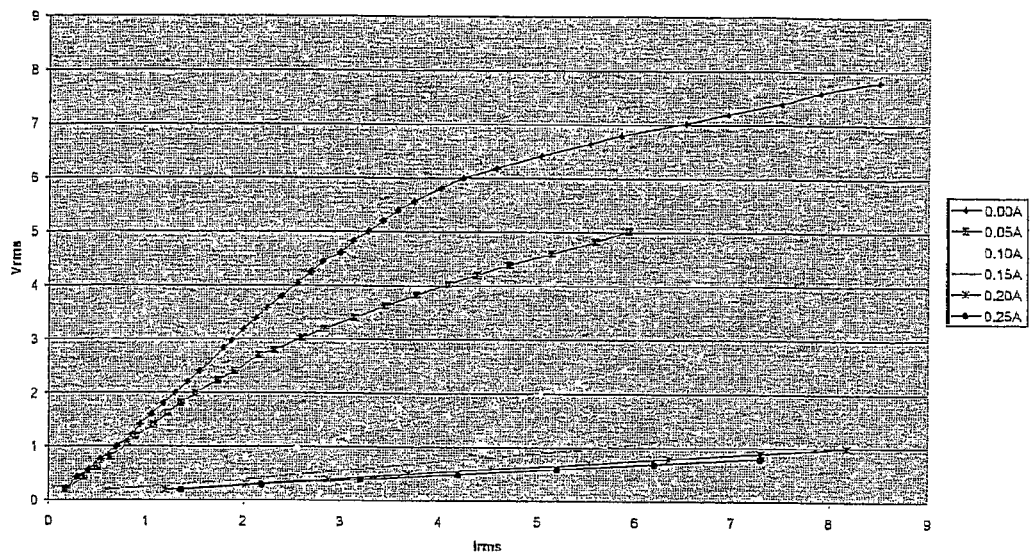
FIG. 10 is a graph of rms voltage (V) against rms current (A) for a saturable inductor, such as the inductor shown in FIG. 11, at 1000 Hz, for different DC bias currents which are shown in the accompanying legend.

As an alternative to the variable inductor topology of L1, S1 and S2 shown in FIG. 1, a saturable inductor may be used. A saturable inductor is one where the core of the inductor is allowed to saturate such that its relative permeability is reduced. Under these conditions the inductance of a winding on that core will reduce. The degree of saturation may be controlled by a DC current applied through a separate winding. In the simplest application and ignoring any distortion in the waveforms an AC voltage applied to the inductor will cause an AC current to flow giving characteristic curves for AC current versus AC voltage as shown in FIG. 10. As the DC current is increased the inductance reduces and a given current is achieved with a much lower voltage.

Figure 11:
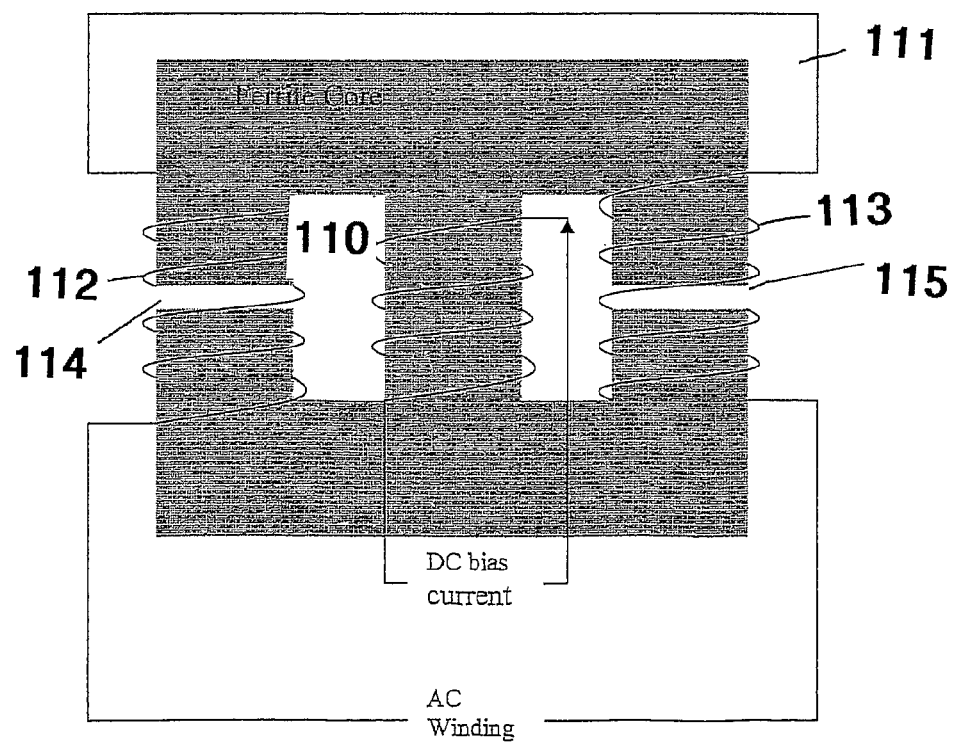
FIG. 11 is an illustrative circuit diagram of a saturable inductor which may be used to provide a controllable variable reactance in a resonant circuit.

An example of a saturable inductor and associated control circuit is shown diagrammatically in FIG. 11. In that figure, DC current is applied to a winding on the centre limb 110 of a magnetic core 111 and AC voltages are applied to windings 112 and 113 on the outer limbs. There is theoretically a perfect balance so that no AC voltage appears on the DC winding. The outside limbs have air gaps 114 and 115 in them to give a more precise inductance when the DC current is zero. As the DC current is increased the inductance of the outer windings is reduced from its maximum value to essentially zero. The circuit may be adjusted to purpose by changing the size and material of the core, the numbers of turns on the windings, and the size of the air gaps.

Use of the circuit of FIG. 1 with an appropriate variable reactance therefore allows resonance to be maintained at all times if required within the pick-up, or also allows control of the natural frequency of the pick-up to thereby provide the load with its required power supply. It will be seen that the circuit is applicable to other forms or types of resonant circuit in an ICPT system, for example the power supply that energises the primary conductive path. The system also allows data to be recorded so that historical data can be stored to analyse the changes in a required to achieve resonance for any resonant circuits over time. Given that under the majority of operating conditions $\alpha$ will not change quickly, this information can then be used to predict the condition and ageing trends of the capacitors within the pick-up circuits and therefore provide better control or correcting techniques in future.

Figure 5:
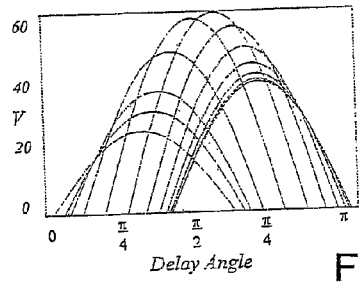
FIG. 5 is a graph of voltage against delay angle of a circuit such as that shown in FIG. 1 having a Q of 12, with the delay varied in 1 microsecond steps or at an angle equivalent to $\pi/24$ at the frequency used.
Figure 6:
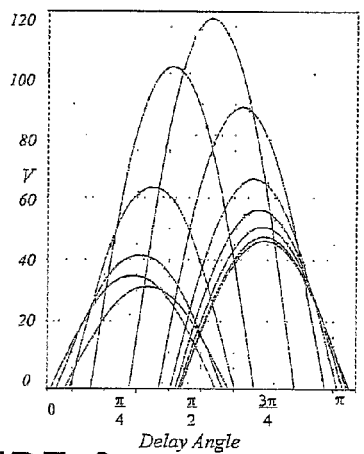
FIG. 6 is a further plot with the same perimeters as that illustrated in FIG. 5, but with the circuit having a Q of 24.

Turning to FIGS. 5 and 6, plots of voltage against delay angle (α) for a controlled resonant circuit such as that shown in FIG. 1 with Q of 12 (FIG. 5), and a Q of 24 (FIG. 6). As can be seen from FIG. 6, tuning is possible, but resolution of α to better than π/24 (i.e. approximately 0.5 microseconds) is needed to be able to tune this circuit.

Figure 7:
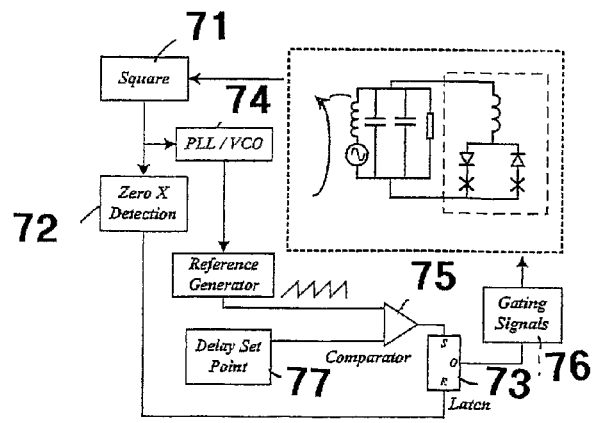
FIG. 7 is a diagrammatic illustration of control apparatus for controlling operation of the circuit shown in FIG. 1.

The various control elements that surround the circuit of FIG. 1 in one embodiment are shown diagrammatically in FIG. 7. Referring to that Figure, a squaring circuit 71 produces a square wave corresponding to the voltage across the resonant circuit, as shown in FIG. 2b. This is provided to zero crossing detection circuit 72 which is used to reset latch 73. The square wave is also used as an input to a phase locked loop 74 which operates to produce an output with phase shifts at all multiples of π/4. The output at π/2 is the usual output for driving the phase locked loop circuitry; the output at π/4 is used to reset a saw tooth wave form as described previously (refer to FIG. 2c). Since the same saw tooth and comparator 75 are used for tuning the positive and negative pulses, DC balance is guaranteed. Simple gates are used to apply the output from the latch 73 to provide gating signals 76 to the correct switch.

The control circuitry is galvanically isolated from the power electronics and is used to isolate the feedback signals and the MOSFET switching signals.

Figure 8:
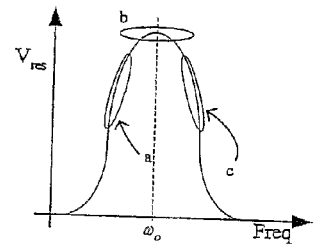
FIG. 8 is a diagram of voltage in a resonant circuit against frequency showing various areas of operation.

The control method which is used in one embodiment implements a search algorithm to find the maximum resonant tank voltage using a correlation technique. The method introduces deliberate perturbations in the value of the variable inductance L1 (FIG. 1) to vary the resonance frequency over a small range (approximately 1% in the preferred example) in a cyclical fashion at a rate of approximately 20 Hz. The operation can be seen in FIG. 8 which shows a typical resonance curve. Conceptually this circuit usually corresponds to a fixed circuit with a variable frequency, but here the frequency is fixed and the circuit parameters vary. Using a correlation method as the tuning frequency shifts to a higher frequency, the voltage of the resonant circuit will increase in region A and decrease in region C but will be neutral in region B. Therefore correlating the resonating voltage (although those skilled in the art will appreciate that other parameters such as resonating current can also be detected) allows an unequivocal measure of which side of resonance the circuit is at, so that the controller can move the resonant frequency ever closer to the ideal resonance condition, or closer to a desired frequency condition such as a desired or required frequency of operation. Similarly, the controller can move the resonant frequency dependent on a desired or required output of the circuit, for example varying the reactance to move an output voltage of the circuit toward a desired or required voltage.

Figure 9:
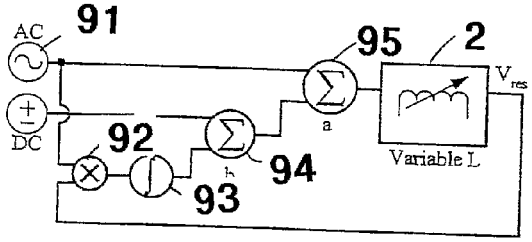
FIG. 9 is a flow diagram showing a correlation control technique according to the invention.

The control voltage consists of a composite signal, with an AC component and a DC component which is applied to the "delay set point" 77 shown in FIG. 7. Referring to FIG. 9, the AC component 91 is a 20 Hz sinewave signal, for example, that creates an alternating change in the resonant inductance producing a change in the resonant frequency which in turn causes a change in the resonant tank voltage. When this change is correlated with the AC component, the result gives the required change to approach resonance. As can be seen in FIG. 9, the resonant output is multiplied with the AC component at multiplication stage 92 following which it is integrated using integrator stage 93. The output of integrator 93 is summed with the DC component using algebraic addition stage 94 and the output of that stage is again summed with the AC input signal at algebraic addition stage 95. The composite signal is then used to provide the delay set point which is introduced to comparator 75 (FIG. 7) to provide the switching signals to the variable inductor tuning circuit 2. A correlation technique essentially multiplies the circuit response by the forcing function and if they are correlated a strongly positive output will be obtained showing that the frequency should be increased. If they are negatively correlated a negative output will be obtained showing that the frequency should be reduced. At perfect tuning only noise will be observed and the frequency can be held constant.

An alternative method is to control the phase between the resonant tank voltage and current to be 90°. This method is more complex than the above system, but ensures maximum power. Ideal power transfer occurs when the track current and the current in the pick-up coil are in quadrature with each other. Thus if it is possible to measure both currents ideal tuning is easily obtained but in practice measurement of the track current is difficult as measurements of the track current using a search coil are contaminated by mutual coupling from the pick-up coil. However, this is an ideal and gives a basis to measure all other techniques against.

Integers of the invention having known equivalents then such equivalents are herein incorporated as if individually set forth.

Although this invention has been described by way of example and with reference to possible embodiments thereof, it is to be understood that modifications or improvements may be made thereto without departing from the scope of the invention as defined in the appended claims.

The invention claimed is:

1. A method for controlling a resonant circuit of an ICPT system; the method comprising:
   generating a cyclical signal;
   using the cyclical signal to cause a cyclical perturbation in a magnitude of a variable reactance in the resonant circuit to thereby produce a cyclical perturbation in the resonant voltage or current of the resonant circuit;
   sensing the perturbation in the resonant voltage or current of the resonant circuit;
   correlating the sensed perturbation in the resonant voltage or current with the cyclical signal to provide a control signal; and
   using the control signal to vary the variable reactance to alter the resonant frequency of the circuit.

2. A method as claimed in claim 1 wherein correlation of the sensed perturbation with the cyclical signal is used to determine whether the frequency of operation of the circuit is above or below the resonant frequency of the circuit.

3. A method as claimed in claim 1 wherein the step of varying the variable reactance comprises varying the reactance to bring the resonant frequency of the circuit toward a required frequency of operation.

4. A method as claimed in claim 1 wherein the step of varying the variable reactance comprises providing a desired output of the circuit and varying the reactance to change the resonant frequency of the circuit to bring an output of the resonant circuit toward a desired output.

5. A method as claimed in claim 1 further comprising integrating the sensed perturbation to provide the control signal for varying the variable reactance.

6. A method as claimed in claim 1 wherein the cyclical signal comprises an alternating control signal of predetermined magnitude.

7. A method as claimed in claim 1 wherein the perturbation varies the variable reactance in such a way as to alter the frequency of the resonant circuit over a range of approximately 1%.

8. A method as claimed in claim 1 wherein the perturbation results in the frequency of the resonant circuit being changed in a cyclical fashion at a rate of approximately 20 Hz.

9. A method as claimed in claim 1 wherein the step of varying the variable reactance comprises varying a current applied to a saturable inductor.

10. An ICPT system comprising:
a resonant circuit having a variable reactance and a controller adapted to:
generate a cyclical signal;
use the cyclical signal to cause a cyclical perturbation in a magnitude of a variable reactance in the resonant circuit thereby producing a cyclical perturbation in the resonant voltage or current of the resonant circuit;
sense the perturbation in the resonant voltage or current of the resonant circuit; and
correlate the sensed perturbation in the resonant voltage or current with the cyclical signal to provide a control signal, and use the control signal to vary the variable reactance to alter the resonant frequency of the circuit.

11. An ICPT system as claimed in claim 10 wherein the controller controls the perturbation to be cyclical.

12. An ICPT system as claimed in claim 10 wherein the controller includes an integrator to integrate the sensed change to provide a control signal for varying the variable reactance.

13. An ICPT system as claimed in claim 10 wherein the variable reactance comprises a variable capacitance.

14. An ICPT system as claimed in claim 10 wherein the variable reactance comprises a variable inductance.

15. An ICPT system as claimed in claim 14 wherein the variable reactance comprises a saturable inductor.

16. An ICPT system pick-up including a resonant circuit having a variable reactance, and a controller adapted to:
generate a cyclical signal;
use the cyclical signal to cause a cyclical perturbation in a magnitude of a variable reactance in the resonant circuit thereby producing a cyclical perturbation in the resonant voltage or current of the resonant circuit;
sense the perturbation in the resonant voltage or current of the resonant circuit; and
correlate the sensed perturbation in the resonant voltage or current with the cyclical signal to provide a control signal, and use the control signal to vary the variable reactance to alter the resonant frequency of the circuit.

17. An ICPT system power supply including a resonant circuit having a variable reactance, and a controller adapted to:
generate a cyclical signal;
use the cyclical signal to cause a cyclical perturbation in a magnitude of a variable reactance in the resonant circuit thereby producing a cyclical perturbation in the resonant voltage or current of the resonant circuit;
sense the perturbation in the resonant voltage or current of the resonant circuit; and
correlate the sensed perturbation in the resonant voltage or current with the cyclical signal to provide a control signal, and use the control signal to vary the variable reactance to alter the resonant frequency of the circuit.

* * * * *